US008194893B1

(12) United States Patent
Lewis

(10) Patent No.: US 8,194,893 B1
(45) Date of Patent: Jun. 5, 2012

(54) WIRED IN-EAR MONITOR SYSTEM

(76) Inventor: Peter G. Lewis, Lafayette, CO (US)

( * ) Notice: Subject to any disclaimer, the term of this patent is extended or adjusted under 35 U.S.C. 154(b) by 757 days.

(21) Appl. No.: 12/238,762

(22) Filed: Sep. 26, 2008

Related U.S. Application Data

(60) Provisional application No. 60/975,844, filed on Sep. 28, 2007.

(51) Int. Cl.
*G10H 1/00* (2006.01)
*H03F 99/00* (2009.01)

(52) U.S. Cl. ........................ 381/118; 381/120

(58) Field of Classification Search ............... 381/118
See application file for complete search history.

(56) References Cited

U.S. PATENT DOCUMENTS

| | | | |
|---|---|---|---|
| 3,644,657 A | 2/1972 | Miller | |
| 4,251,688 A * | 2/1981 | Furner | 381/18 |
| 4,852,444 A | 8/1989 | Hoover et al. | |
| 4,881,123 A | 11/1989 | Chapple | |
| 4,909,126 A | 3/1990 | Skinn et al. | |
| 5,007,324 A | 4/1991 | DeMichele | |
| 5,449,858 A | 9/1995 | Menning et al. | |
| 6,640,257 B1 * | 10/2003 | MacFarlane | 710/1 |
| 6,686,530 B2 | 2/2004 | Juszkiewicz et al. | |
| 7,692,090 B2 * | 4/2010 | Negoescu et al. | 84/718 |
| 2004/0030425 A1 | 2/2004 | Yeakel et al. | |
| 2004/0261607 A1 * | 12/2004 | Juszkiewicz et al. | 84/645 |
| 2006/0045256 A1 * | 3/2006 | Erdman | 379/266.07 |
| 2007/0052414 A1 * | 3/2007 | Venegas et al. | 324/303 |
| 2007/0137880 A1 | 6/2007 | Klotz | |
| 2007/0263884 A1 * | 11/2007 | Bedingfield, Sr. | 381/119 |
| 2007/0282467 A1 * | 12/2007 | Rodrigues et al. | 700/83 |
| 2008/0127803 A1 * | 6/2008 | Liu | 84/411 R |
| 2009/0282967 A1 * | 11/2009 | Skillings | 84/742 |
| 2010/0169534 A1 * | 7/2010 | Saarinen et al. | 710/316 |

OTHER PUBLICATIONS

IXM Jump Overview Scan of website showing prior art system. System shown is admitted prior art to current application.

* cited by examiner

*Primary Examiner* — Zandra Smith
*Assistant Examiner* — Igwe U Anya
(74) *Attorney, Agent, or Firm* — Patent Law Offices of Rick Martin, P.C.

(57) ABSTRACT

A portable in-ear audio monitor system for a musician having reduced and simplified overall parts. The in-ear audio system providing the musician with time saving setup and teardown instrumentation for a performance. The invention provides an improved method and apparatus to allow a musician precise monitoring, more movement about stage, reduction in cables needed and improved simplicity of pre-performance setup of equipment. It eliminates the need for a hip pack, distribution box and wedge speaker providing a single cable system having a small and simple splitter jack for the headset and the instrument. Direct 'in-ear' monitoring is provided via a monitor box, having line level or speaker level input signals from a sound monitor, and feeding a headphone without using a wired or wireless hip pack. Monitor signal radio interference and noise is greatly reduced. Headset volume control is provided along with an optional reverb and/or sound equalizer.

4 Claims, 8 Drawing Sheets

WIRED IN-EAR MONITOR SYSTEM

CROSS REFERENCE APPLICATIONS

This application is a non-provisional application claiming the benefits of provisional application No. 60/975,844 filed Sep. 28, 2007.

FIELD OF INVENTION

The present invention relates to audio monitors, and more particularly, to a portable in-ear audio monitor system for a musician that simplifies the overall parts, function of like parts, and set-up while during a stage performance.

BACKGROUND OF THE INVENTION

It is known in the art to provide sound reference monitoring via a 'wedge speaker' located near the performing musician. Such a system is shown as part of FIG. 1. FIG. 1 is a stage venue 100 diagram showing one musician 10 on the stage 40. It should be noted that there is typically more than one musician and one instrument on stage and the description below will apply to all instruments although only one instrument, a guitar is shown by way of example and not of limitation. The musician plays electric guitar 12 with output wire 13 feeding onstage amplifier/speaker 16. Amplifier/speaker 16 output is picked up by on-stage microphone 14 and sent to performer(s) stage sound mixer 20 via cable 18. Performer(s) stage sound mixer 20, in turn, feeds amplifier 22 via cable 21 and amplifier 22 drives wedge speaker 26 via cable 24. The performer can hear a requested mix of all on-stage instruments via wedge speaker 26 and can hear the guitar output directly via the speaker on amplifier/speaker 16. The guitar 12 output from amplifier/speaker 16 is picked up by on-stage microphone 14 and fed to performer(s) stage sound mixer 20 via cable 18. All other instrumentation on stage will also feed performer(s) sound mixer 20. Performer(s) stage sound mixer 20 splits the signal received on cable 18. This $2^{nd}$ output (i.e. "alternate output") is sent to audience sound mixer 30 via cable 28. Audience sound mixer 30 feeds amplifiers 36, 37, which drive respective on-stage house speakers 38, 39. Thus audience 42 can listen to the performance output. Performer(s) stage sound mixer 20 and audience sound mixer 30 will typically each have a person (not shown) controlling their respective outputs. In this setup wedge speaker 26 is placed stably on the ground with the sound being broadcast upwards towards musician 10. One problem is that wedge speakers tend to have a very tight broadcast field to ensure that sound is only heard if the performer is standing directly in front of the wedge. This is to ensure that when multiple wedges are used, the different sounds are restricted to different parts of the stage instead of all joining together into an unidentifiable mess. Musicians also need to make sure that the vocal element of a microphone is pointed away from the wedge speakers to minimize feedback. This limits the musician's ability to roam about stage 40 and continue to monitor the music without interference or causing a signal with added effects such as reverberation, echo, delay or chorus.

It is also known in the prior art to provide in-the-ear monitoring systems to allow musicians to monitor audio signals as the musician is performing. These typically require hip or belt pack, a distribution box with an audio line level output and a breakout box. These require use of multiple cables and wires to accomplish headset monitoring limiting movement by the musician. Headset systems as such typically require a line level input, and cannot accept a speaker level signal.

U.S. Patent Application US 2004/0208328 A1 to Strother (filed Apr. 15, 2003) is an audio monitoring and mixing system comprising a portable monitoring circuit (or hip pack), a breakout box, and a distribution circuit. The portable monitoring circuit includes a mixer for mixing audio signals to provide a mixed audio signal to an individual musician and a feedthrough for patching out an instrument effects signal. The breakout box includes a feedthrough circuit for distribution the first plurality of audio signals to the portable monitoring circuit and a second feedthrough for patching through the instrument effects signal from the portable monitoring circuit and providing the signal to an instrument effects processor. The distribution circuit receives audio signals and provides select ones to the portable monitoring system.

The present invention provides an improved method and apparatus to allow a musician precise monitoring, more movement about stage, a reduction in cables needed and an improved simplicity of pre-performance setup of equipment. It eliminates the need for a hip pack, distribution box and wedge speaker.

SUMMARY OF THE INVENTION

The primary aspect of the present invention is to provide a single cable system having a small and simple splitter jack for the headset and the instrument.

Another aspect of the present invention is to eliminate the commonly found 'wedge' monitor speakers and provide a direct 'in-ear' monitoring system.

Another aspect of the invention is to provide for direct acceptance of a line level or speaker level signal from a sound monitor mixer without using a wired or wireless hip pack.

Another aspect of the invention is to provide use of an in-ear monitor allowing either 'line' or 'speaker' input to the system.

Another aspect of the present invention is to provide for more flexibility in a venue allowing a musician faster set-up, faster teardown, and more movement about stage.

Still another aspect of the present invention is to eliminate problems in wireless radio interference and noise.

Another aspect of the present invention is to allow the musician control of headset volume and optionally control the sound via a reverb and/or sound equalizer.

Yet another aspect of the present invention is to provide an affordable means of musician on-stage monitoring.

Other aspects of this invention will appear from the following description and appended claims, reference being made to the accompanying drawings forming a part of this specification wherein like reference characters designate corresponding parts in the several views.

The present invention improves upon the aforementioned Strother Pat. Application in the following ways:

1. The hip pack is eliminated and thus cost. Doing this, the user no long has mixing controls on the monitor mix.
2. The distribution box is eliminated. The monitor mix, in the present invention, is taken from the wedge speaker line or from a line level source taken directly from the monitor-mixing console.
3. Elimination of a microphone channel anywhere in the system. The present invention applies specifically to guitarists, bassists, violinists and any musician that uses a direct input for their instrument. That is, they connect their instrument to either their Amp, Pedals, or DI-box using a standard ¼ inch instrument cable.
4. A single monitor box is used with basic features (ref. FIGS. 3, 3A below).
5. The monitor box accepts a speaker line signal.

6. A new type of T-jack is provided to the performer end of a special instrument/monitor cable (ref. FIGS. 4, 4A, 6 below).
7. A single multi-pin cable connector is used between the monitor box and the T-jack (ref. FIGS. 3, 3A, 4, and 4A).
8. An attenuator (limiter) is added to the monitor signal for safety reasons (ref. FIGS. 3, 3A).
9. An optional equalizer and reverb can be added to the monitor box (ref. FIGS. 3A, 5A).

The present invention results in a more user friendly and lower cost system providing for shorter set-up time, more comfort for the performer, less work for the house sound person (especially when using the speaker line connection) and is compatible for use in less advanced sound systems.

The present invention will be described with a single musician and instrument. It should be noted that the instrument shown is a guitar, which is shown by way of example and not of limitation.

The modular monitor system (MMS) of the present invention comprises:
1. A monitor box which receives a line or speaker input from a monitor sound mixer to an input connector;
2. The monitor box having a fixed or adjustable attenuator for speaker level input;
3. The monitor box having a headphone amplifier and volume control for the musician receipt of the monitor sound mixer input;
4. The monitor box having a second connector sending a monitor mix to a musician headset via a 'T-jack', preferably through a single cable;
5. The single cable also containing the received output of the instrument;
6. A T-jack having three cables connected to it such that on one side is the aforementioned single cable; on another side the monitor mix is a second cable going out to a musician headset; and on the third side is an input cable from the instrument output;
7. The T-jack being manufactured as one unit integral with the three cables or manufactured having one or more of the cables attached via one or more connectors;
8. The monitor box having an output sending the instrument signal out to a speaker/amplifier;
9. The monitor box also having the capability to have an optional reverb unit or an optional equalizer.

The present invention provides an affordable means for musicians to obtain on-stage music monitoring while enabling freedom of movement.

BRIEF DESCRIPTION OF THE DRAWINGS

FIG. 5A is front perspective view of an example of the basic IMB with the optional reverb and equalizer added.

Before explaining the disclosed embodiment of the present invention in detail, it is to be understood that the invention is not limited in its application to the details of the particular arrangement shown, since the invention is capable of other embodiments. Also, the terminology used herein is for the purpose of description and not of limitation.

DETAILED DESCRIPTION OF THE DRAWINGS

Figure 1:
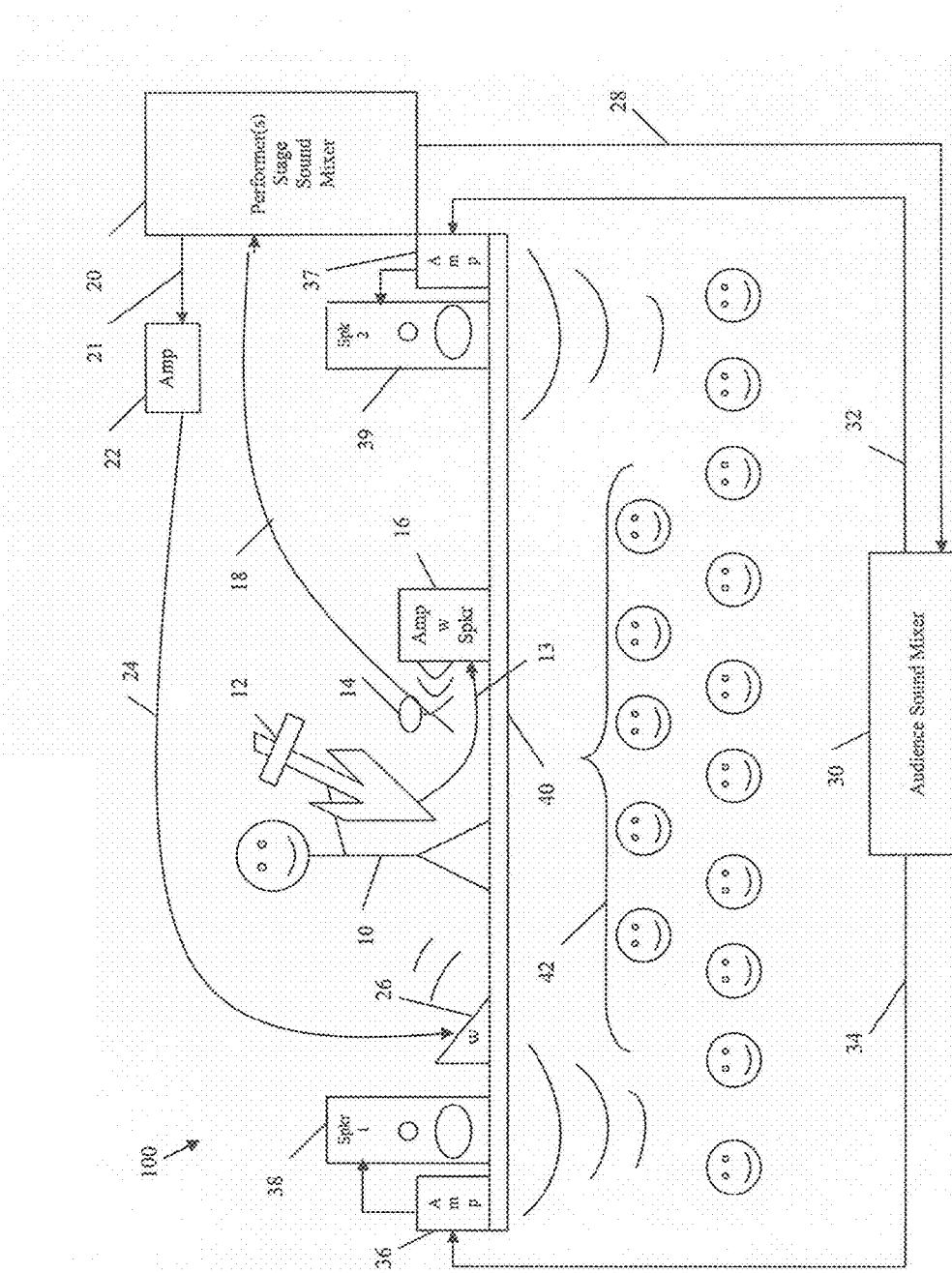
FIG. 1 is a stage venue diagram showing one musician on a stage with a prior art setup having a wedge speaker.
Figure 2:
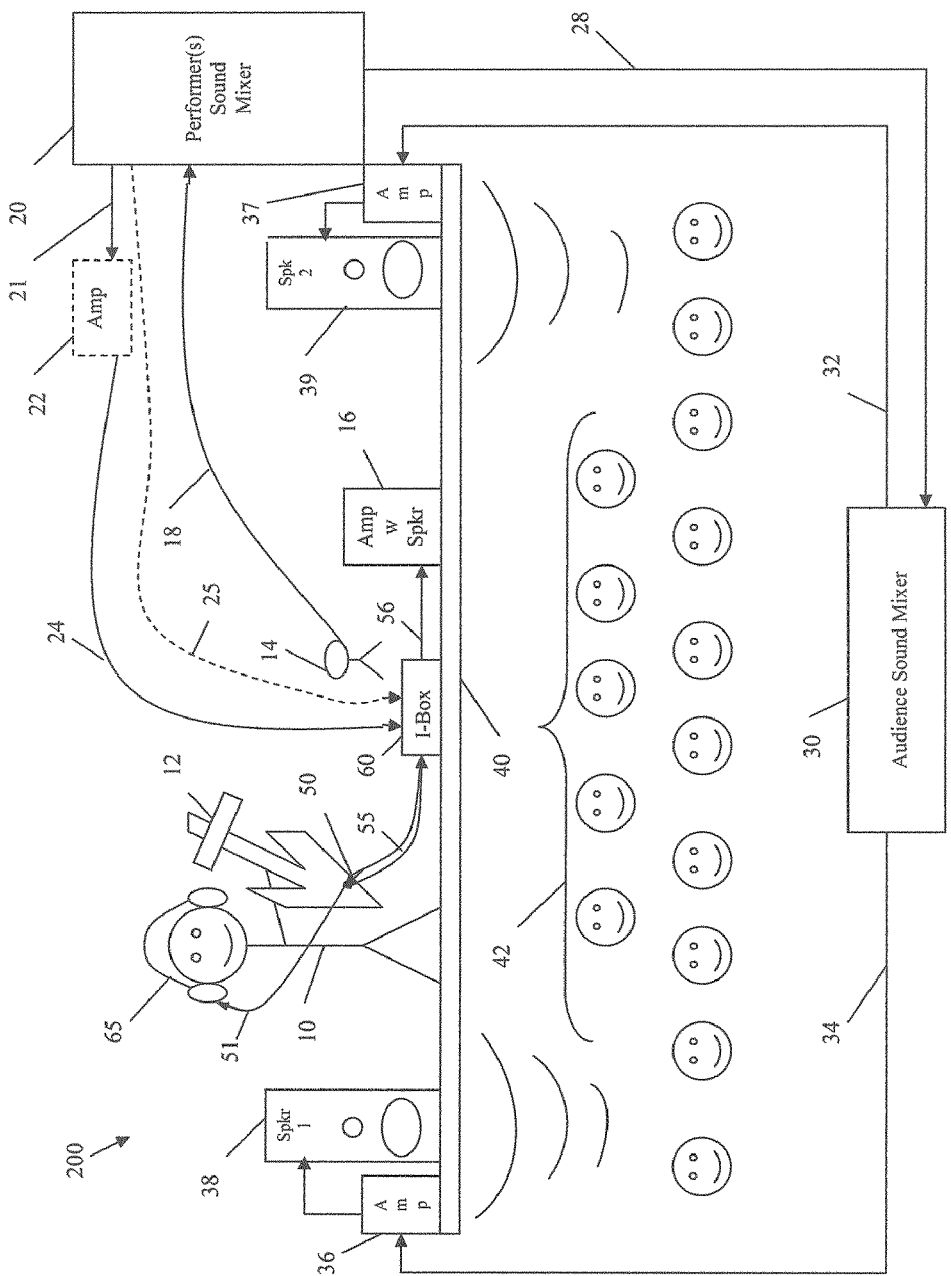
FIG. 2 is a stage venue diagram showing one musician on a stage with the system of the present invention.
Figure 3:
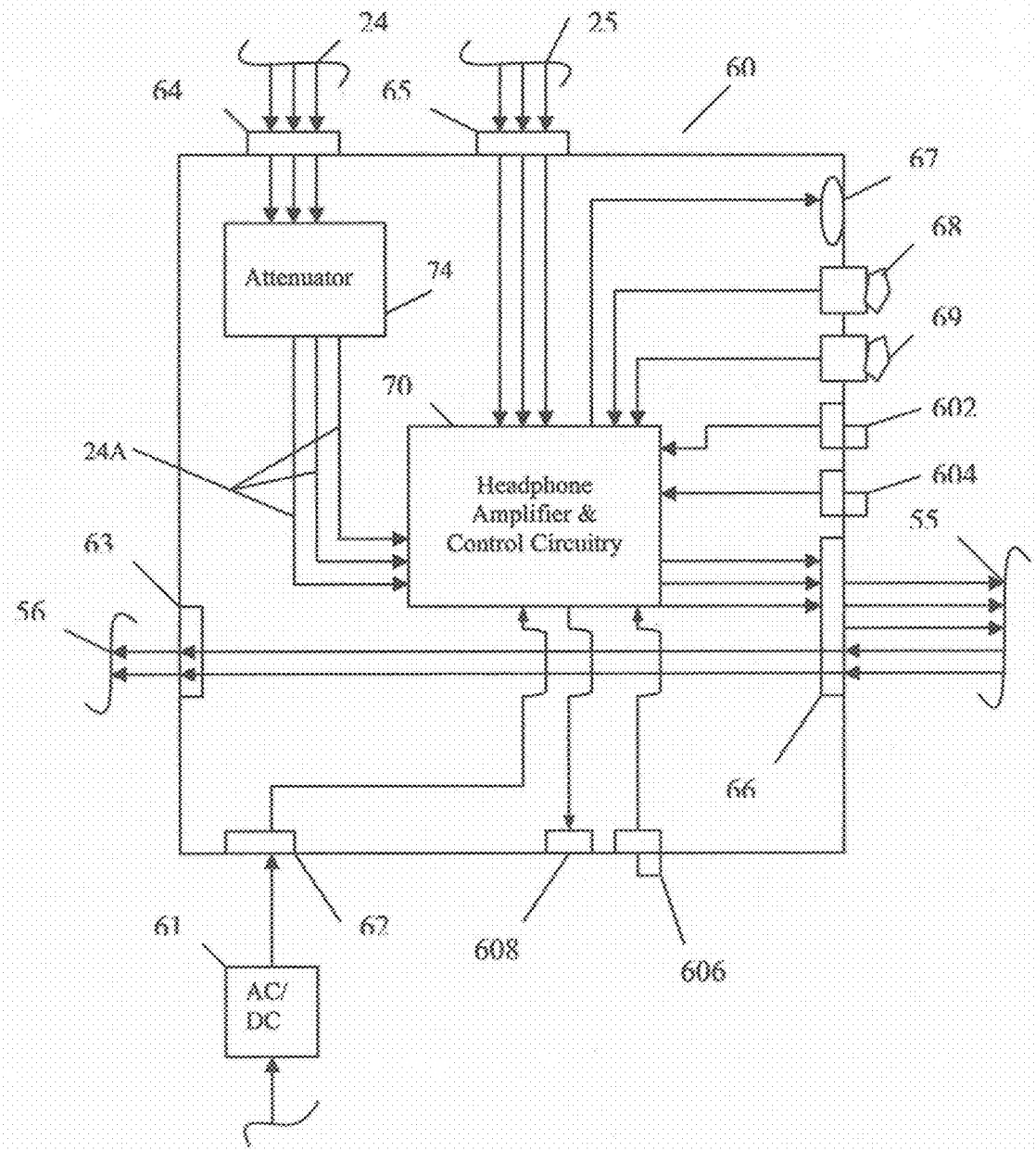
FIG. 3 is a schematic of the basic invention monitor box of the present invention.
Figure 4:
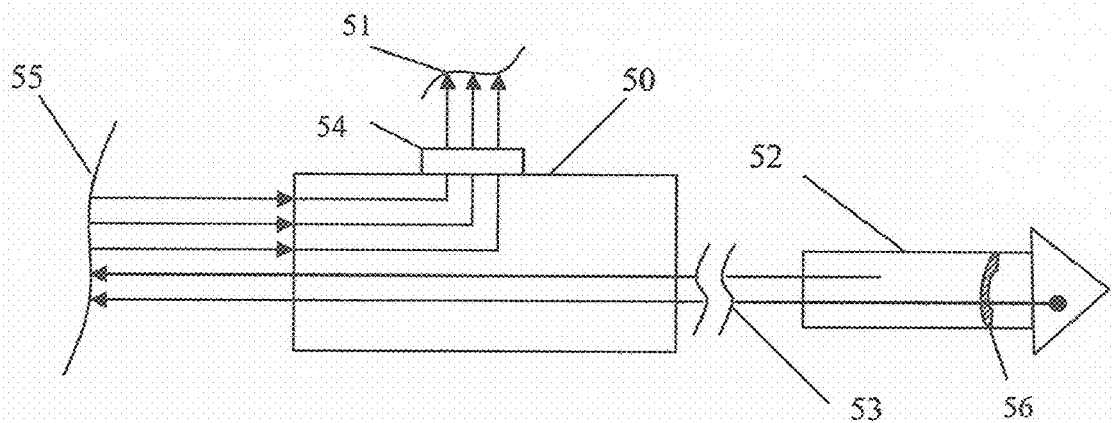
FIG. 4 is a side perspective of T-jack connector and associated cables.

FIG. 2 is a stage venue diagram showing one musician 10 on a stage 40 with the system of the present invention. Shown is invention monitor box (IMB) 60 having and input from performer(s) stage sound mixer 20, via amplifier 22 fed by cable 21 from performer(s) stage sound mixer 20. Amplifier 22 feeds a speaker level signal directly into IMB 60 via speaker level input cable 24. It should be noted that IMB 60 could also receive line level input, shown as direct cable 25. Thus, amplifier 22 is not a requirement for the MMS of the present invention and can be eliminated. IMB 60 thus can receive a line level input cable 25 or speaker level input cable 24 inputs from performer(s) stage sound mixer 20 to an input connector, depending on whether or not amplifier 22 is present. If the input is a speaker level IMB 60 contains a fixed or adjustable attenuator for speaker level input. IMB 60 has an internal headphone amplifier and volume control for the musician receipt of the monitor sound mixer input wither as a speaker or line level input. FIG. 3 below will explain the IMB in more detail. IMB 60 connects to musician cable 55 (ref. FIG. 4) that contains the instrument level input signal and the stage monitor headphone level output signal. T-jack 50 will split the instrument and headphone signals. Headphone cable 51 plugs into T-jack 50 and is the headphone cable to musician headphone set 65. IMB 60 will also output the instrument level signal directly to an on-stage instrument amplifier/speaker 16 via instrument output cable 56. It should be noted that IMB 60 could also have optional sound mixer and/or reverb units attached for the musician to tune the stage monitoring inputs from performer(s) sound mixer 20.

FIG. 3 is a schematic of the basic invention monitor box (IMB) 60 of the present invention. IMB 60 has four basic input/output connectors:
A. A DC input received from AD/DC converter 61 with the DC output going to DC connector 62. A power-on LED 608 indicates presence of power;
B. An instrument level output connector 63 into which hooks instrument output cable 56 going to on-stage instrument amplifier/speaker 16;
C. Performer(s) sound mixer line level input cable 25 going to line level connector 65 or speaker level input cable 24 input going to speaker level input connector 64, either coming from performer(s) stage sound mixer 20 or wedge speaker 26.
D. Musician instrument cable connector 66 that contains the instrument level input signal and the stage monitor headphone level output signal connected via musician cable 55.

IMB 60 has internal circuitry found readily available in prior art. Attenuator 74 will receive signal input from speaker level input cable 24 coming from performer(s) stage sound mixer 20 (which also passes through amp 22, ref. FIG. 2) and attenuate the speaker level signal to an attenuated speaker level on internal cable 24A, which is basically then a line level signal as is a direct line level signal on line level input cable 25. Headphone amplifier and control circuitry 70 receives the line level input signal from cables 25 or 24A and sends a volume controlled stage monitor headphone level output signal to musician instrument cable connector 66 and musician cable 55. The musician (performer) can control headset levels via volume control 68. Alert LED 67 will light up a 'red alert' if, by accident, a speaker level signal is inputted to line level connector 65. It should be noted that a small alarm signal speaker could be used in lieu of or in addition to an LED alert. If a speaker level signal were detected by control circuitry 70, i.e. a wrong connection, then the control circuitry would cut off any output to the headphone. IMB 60 would sit on stage near the musician and is easily configured by the musician or a stage set-up person having only one cable out to the musician's instrument/headphone. It will allow for more movement about stage by the musician and control by the musician of the monitor input to the musician headset.

Gain control 69 allows the musician to adjust performer(s) sound mixer line level input with an additional 20 db attenuation switch 604 if the input is to high. Monitor input ground lift switch 602 could be used to reduce any noise coming from a ground loop from the input monitor signal. An AC IMB ground lift switch 606 is also provided. It should be noted that many of the elements are shown by way of example and not of limitation.

Figure 3A:
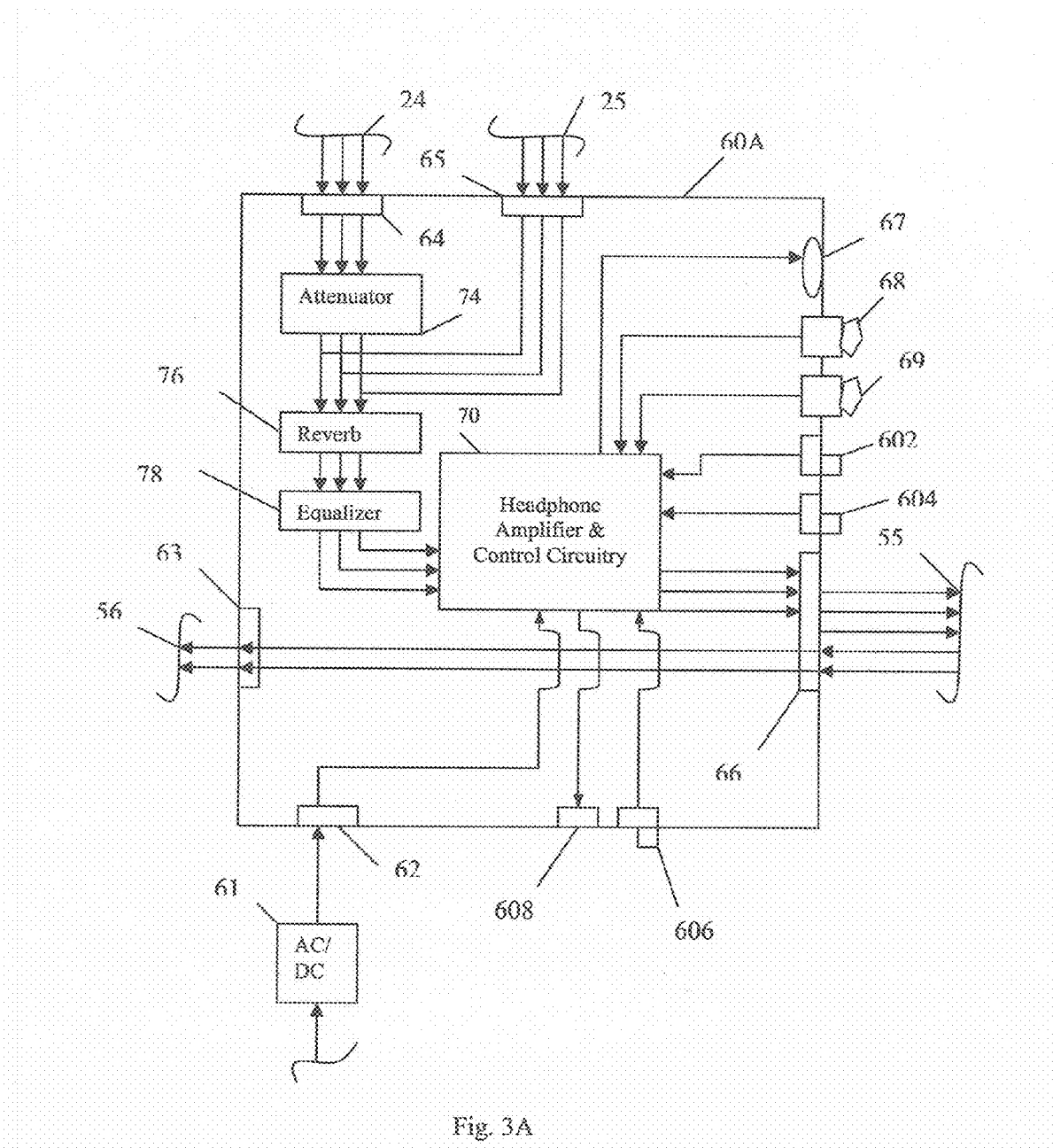
FIG. 3A is a schematic of an alternate embodiment of the invention monitor box of the present invention having a reverb and/or an equalizer function.

FIG. 3A is a schematic of an alternate embodiment of the invention monitor box 60A of the present invention having a reverb 76 and/or an equalizer 78 function. Reverb 76 and equalizer 78 may be packaged within one IMB unit or packaged as separate units within one rack with the basic IMB (ref. FIG. 5A below).

FIG. 4 is a side perspective of T-jack connector 50 and associated cables. This T jack connector 50 can be built by using a standard instrument cable with the instruments jack at one end and a second male jack into the monitor box at connector 66. The three wire headphone connector 54 can be a cable also connected to connector 66, the two cables wrapped together. A monitor mix to a musician headset 65 (ref. FIG. 2) is sent through musician cable 55 into T-jack 50 which then splits the monitor signal out via headphone connector 54 into headphone cable 51. Headphone cable 51 plugs into T-jack 50 and is the headphone cable to musician headphone set 65 (ref. FIG. 2). Instrument jack 52 plugs into the musician instrument, for example a guitar, and is shown with ground/signal insulator 56. It sends the instrument output signal via instrument cable 53 and passing through T-jack 50 into musician cable 55 and going to IMB 60 musician instrument input connector 66 (ref. FIGS. 3, 3A). In this embodiment, T-jack 50 would be manufactured as one unit with musician cable 55 and instrument cable 53. T-jack 50 would have one output headphone connector 54. Another option would be to have instrument cable 53 have a connection at both the instrument end (i.e. instrument jack 52) and also a connection at T-jack 50 end (not shown).

Figure 4A:
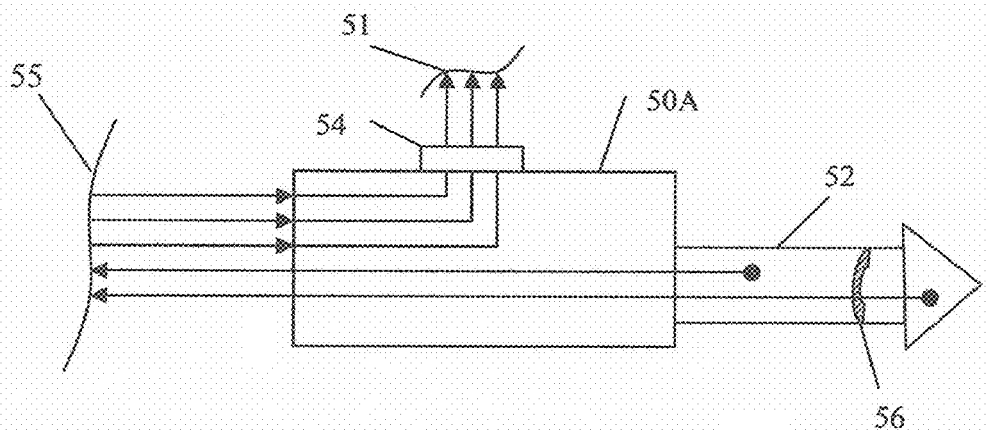
FIG. 4A is a side perspective of an alternate embodiment of the T-jack connector and associated cables.

FIG. 4A is a side perspective of an alternate embodiment of the T-jack connector 50A and associated cables. In this embodiment T-jack 50A has instrument connector 52 manufactured as an integral unit within the T-jack itself. Thus T-jack 50A would plug directly into the musician's instrument via instrument connector 52 with the headphone connected as previously mentioned. It should be noted that other geometric shapes of the T-jack and connectors can easily be designed and are not limited by the scope of the present invention.

Figure 5:
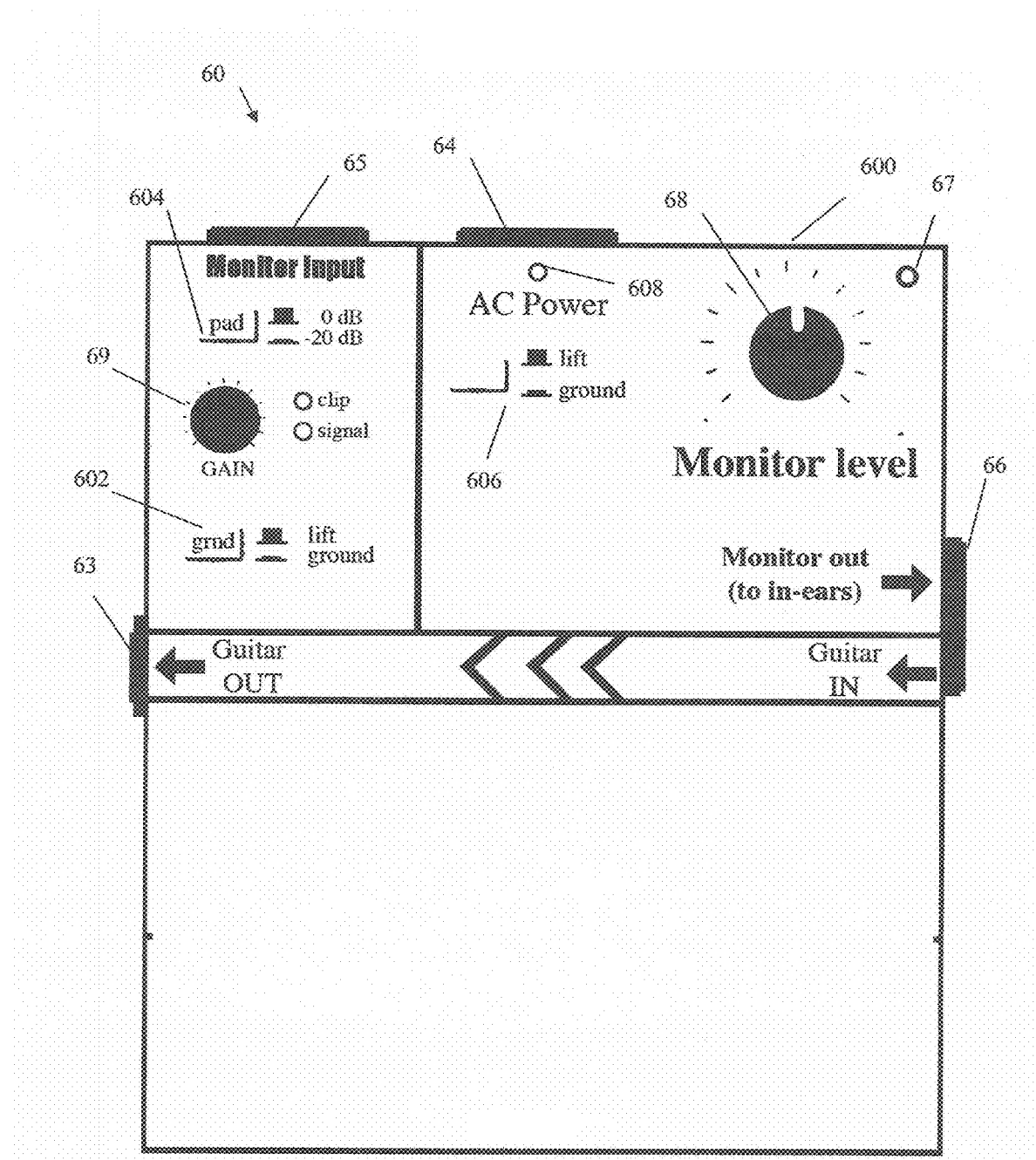
FIG. 5 is front perspective view of an example of the basic IMB of the present invention.
Figure 9A:
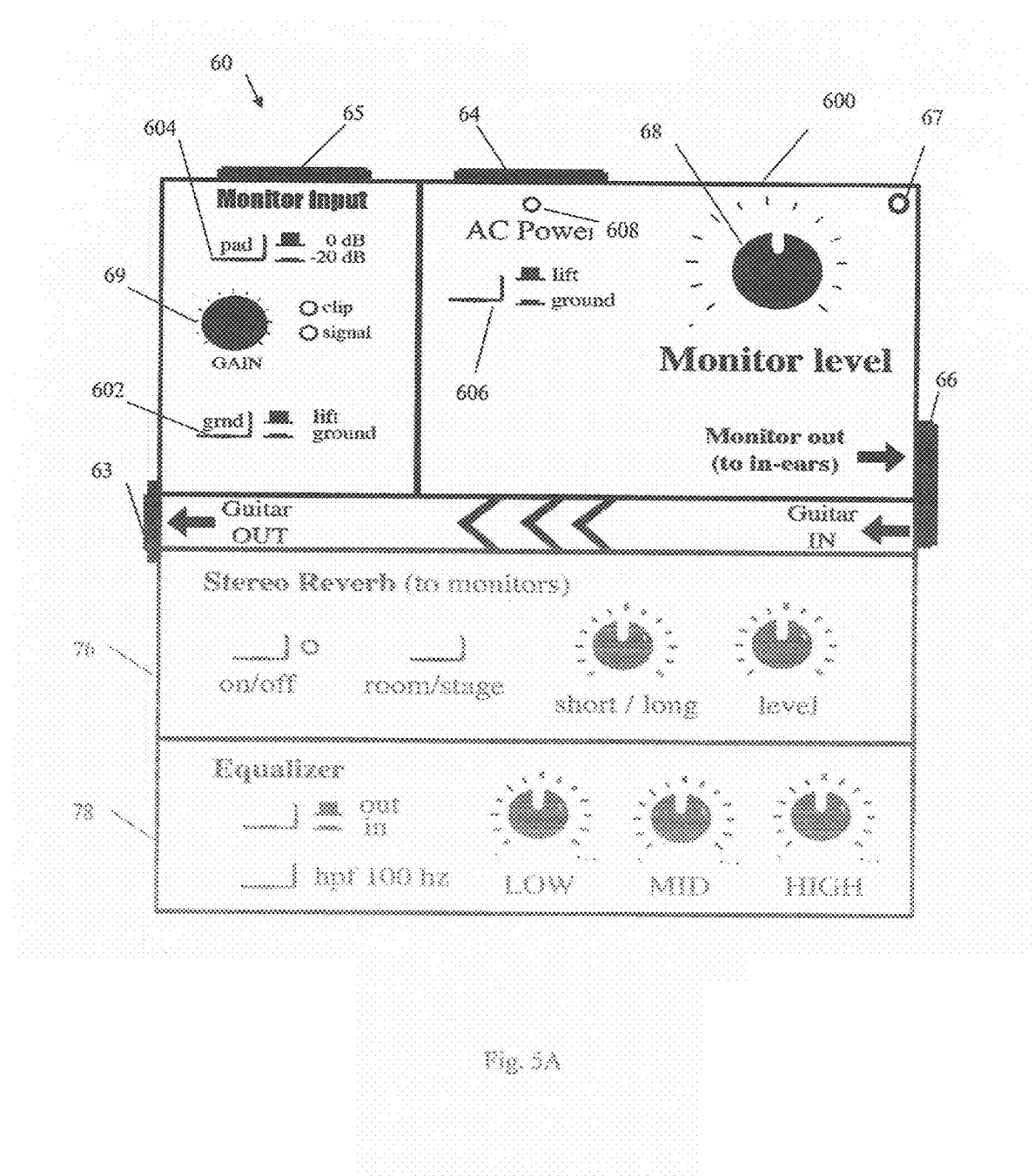

FIG. 5 is front perspective view of an example of the basic IMB 60 of the present invention. It is presented by way of example and not of limitation. Chassis box 600 is preferred to be designed as a rack mounted box to accept other components such as a reverb or equalizer. The musician instrument cable input connector 66 ('Guitar IN'), and instrument level output connector 63 ('Guitar OUT') are shown on the side if IMB. The aforementioned line level connector 65 and speaker level input connector 64 are shown on the top side of IMB 60. Frontal controls include gain control 69, 20 db attenuation switch 604, ground lift switch 602 AC ground lift switch 606 is also provided along with a power-on LED 608. Alert LED 67 is shown in the upper right corner. It should be noted that many of the elements are shown by way of example and not of limitation.

FIG. 5A is front perspective view of an example of IMB 60 with the optional reverb unit 76 and equalizer 78 added as rack mounted components. Standard reverb and equalizer controls are shown. Equalizer 78 can be placed in or out of the monitor signal path with a high band pass filter engaged or disengaged. Shown are simple low, midrange, and high frequency controls. Reverb unit 76 is shown with a basic on/off switch, a room/stage effect switch and controls for the level and reverb range. The reverb and equalizer are shown by way of example and not of limitation. Additional functional boxes could also be added.

Figure 6:
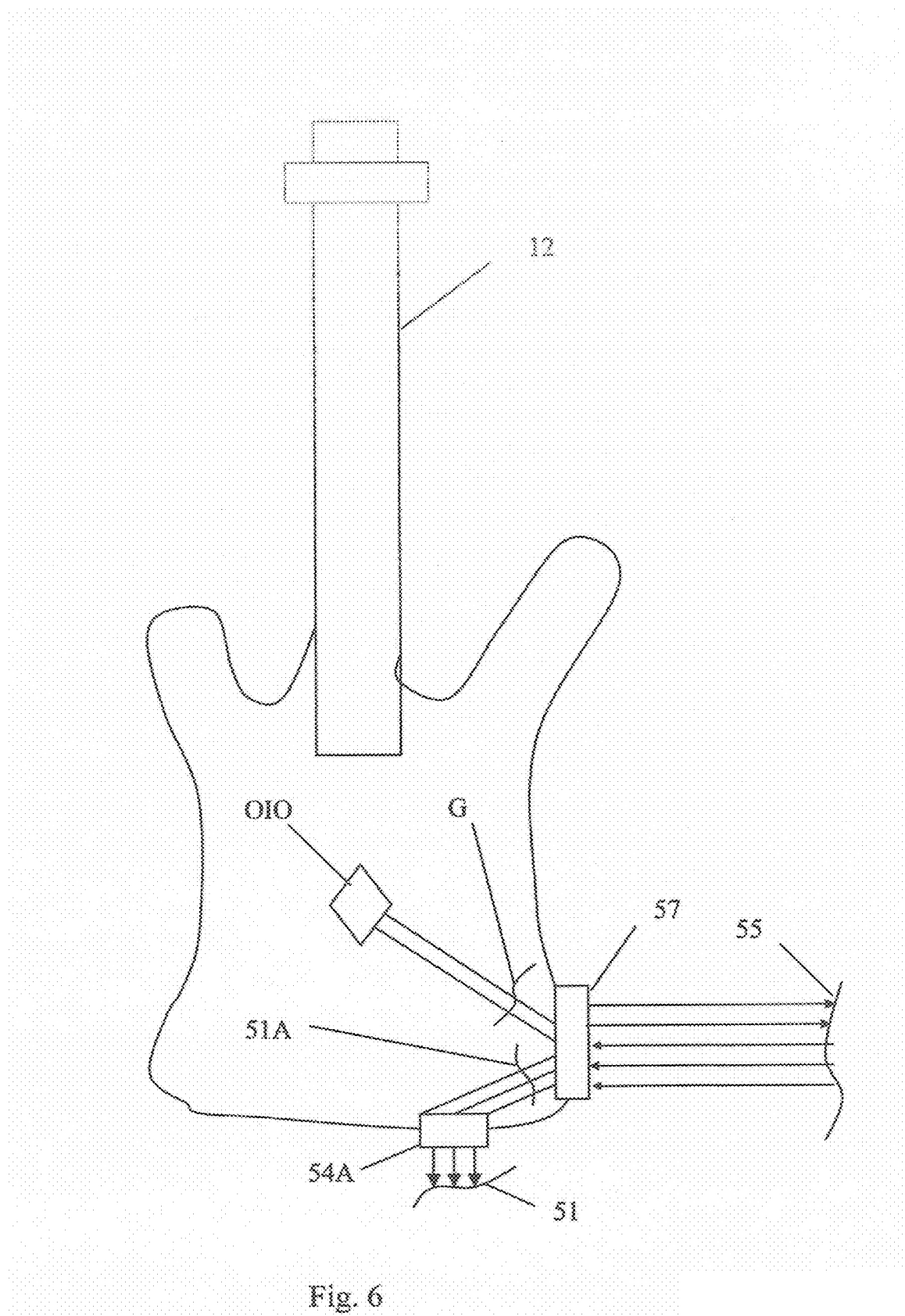
FIG. 6 is an alternate embodiment of the musician cable connection with internal instrument wiring.

FIG. 6 is an alternate embodiment of the musician cable 55 connection with internal instrument wiring. This alternate embodiment is presented by way of example and not of limitation. FIG. 6 represents an alternate way of splitting the headphone signal and the instrument signal at the performer end of the musician cable 55. With this alternate wiring, guitar 12 body contains internal wiring that splits the instrument and headphone signals as previously described in T-Jack connector (ref 50, 50A in FIGS. 4, 4A). Multi-pin jack 57 is located on the body of guitar 12. It should be noted that prior art would have a standard instrument ¼ inch cable connected to the guitar. Musician cable 55 connects to multi-pin jack 57. Internal to guitar 12 the two signal paths, internal headphone cable 51A and internal instrument cable G, are split. The internal instrument cable G is connected to the original instrument outputs OIO normally found inside the instrument. The headphone cable 51A is connected to headphone output jack 54A located on the outside of the instrument body. Headphone output jack 54A is typically an $1/8^{th}$ inch female headphone jack (which is the exact same style and performs the same function as headphone connector 54 found in FIGS. 4, 4A.) Headphone cable 51 plugs into headphone output jack 54A and sends the headphone signal up to the performer's in-ear-monitors.

Although the present invention has been described with reference to preferred embodiments, numerous modifications and variations can be made and still the result will come within the scope of the invention. No limitation with respect to the specific embodiments disclosed herein is intended or should be inferred. Each apparatus embodiment described herein has numerous equivalents.

I claim:

1. An analog audio control system comprising:
   a monitor box having at least five analog input/output connectors;
   said connectors including a DC power input, an instrument level analog output connector suited to receive a cable for an on-stage instrument amplifier/speaker, a sound mixer line level input connector, a speaker level input connector, a musical instrument and headphone cable connector that contains an analog two wire instrument signal and an analog three wire headphone output signal;
   said monitor box having an attenuator connected to the speaker level input connector and said attenuator having an output to a headphone amplifier;

said headphone amplifier having an input from the sound mixer line level input connector;

said headphone amplifier having an analog three wire output (ground, left, right) to the musician instrument and headphone cable connector;

said musician instrument and headphone cable having a direct connection with its analog two wire instrument signal to the instrument level output connector;

a T jack connector connected to the musician instrument and headphone cable;

said T jack connector comprising a five wire port for the receiving analog three wire headphone amplifier output and passing through the analog two wire instrument signal from an instrument jack;

said T jack connector comprising an analog two wire port for connecting the instrument jack analog two wire signal thereto; and said T jack connector comprising an analog three wire headphone cable connector which connects to the analog three wire headphone amplifier output.

2. The apparatus of claim 1, wherein the analog two wire port for connecting the analog instrument jack two wire signal thereto further comprises a flexible cable connected directly to the analog monitor box musician instrument and headphone cable connection.

3. The apparatus of claim 2, wherein the flexible (two wire) cable is wrapped next to a three wire headphone cable to form the T jack.

4. The apparatus of claim 1, wherein the analog two wire port for connecting the analog instrument jack two wire signal thereto further comprises part of a plug which also contains the analog five wire port and the analog three wire headphone connector.

* * * * *